(12) United States Patent
Uhrich et al.

(10) Patent No.: US 9,112,163 B2
(45) Date of Patent: Aug. 18, 2015

(54) PHOTOACTIVE COMPONENT HAVING A PLURALITY OF TRANSPORT LAYER SYSTEMS

(75) Inventors: Christian Uhrich, Dresden (DE); Bert Maennig, Dresden (DE); Martin Pfeiffer, Dresden (DE); Gregor Schwartz, East Palo Alto, CA (US)

(73) Assignee: Heliatek GmbH, Dresden (DE)

( * ) Notice: Subject to any disclaimer, the term of this patent is extended or adjusted under 35 U.S.C. 154(b) by 0 days.

(21) Appl. No.: 13/806,475
(22) PCT Filed: Jun. 21, 2011
(86) PCT No.: PCT/EP2011/060355
§ 371 (c)(1),
(2), (4) Date: Mar. 11, 2013
(87) PCT Pub. No.: WO2011/161108
PCT Pub. Date: Dec. 29, 2011

(65) Prior Publication Data
US 2013/0160829 A1    Jun. 27, 2013

(30) Foreign Application Priority Data
Jun. 21, 2010   (EP) .................................... 10166619

(51) Int. Cl.
*H01L 31/0224*   (2006.01)
*H01L 31/04*   (2014.01)
(Continued)

(52) U.S. Cl.
CPC .............. *H01L 51/4246* (2013.01); *B82Y 10/00* (2013.01); *H01L 27/302* (2013.01);
(Continued)

(58) Field of Classification Search
CPC .............. H01L 21/302; H01L 51/0032; H01L 51/0034; H01L 51/0035; H01L 51/0046; H01L 51/0051; H01L 51/0053; H01L 51/42; H01L 51/424; H01L 51/4246; H01L 51/002; H01L 51/0085; H01L 51/5048; H01L 51/5052; H01L 51/0068; H01L 51/006; H01L 2251/308; H01L 27/302; H01L 31/035272; Y02E 10/549; B82Y 10/00
USPC ..................... 136/243–265; 257/40, E51.026
See application file for complete search history.

(56) References Cited

U.S. PATENT DOCUMENTS 5,093,698 A   3/1992 Egusa
6,559,375 B1   5/2003 Meissner et al.
(Continued)

FOREIGN PATENT DOCUMENTS

DE   10 2004 014 046 A1   9/2004
DE   103 38 406 A1   3/2005
(Continued)

OTHER PUBLICATIONS

Rico Schueppel, Ronny Timmreck, Nikola Allinger, Toni Mueller, Mauro Furno, Christian Uhrich, Karl Leo, and Moritz Riede, "Controlled current matching in small molecule organic tandem solar cells using doped space layers" (published Feb. 17, 2010).*
(Continued)

*Primary Examiner* — Jennifer Michener
*Assistant Examiner* — Mayla Gonzalez Ramos
(74) *Attorney, Agent, or Firm* — Slater & Matsil, L.L.P.

(57) ABSTRACT

A photoactive component has an electrode and an opposing electrode. The electrodes have at least one organic layer system arranged between them, also having at least two photoactive layer systems and, between the photoactive layer systems, at least two different transport layer systems have the same charge carrier type. In this case, one transport layer system matches one of the two photoactive layer systems in energy terms, while the other transport layer system is of transparent design.

19 Claims, 12 Drawing Sheets

(51) Int. Cl.

| | | |
|---|---|---|
| *H01L 31/042* | (2014.01) | |
| *H01L 51/00* | (2006.01) | |
| *H01L 51/42* | (2006.01) | |
| *H01L 51/44* | (2006.01) | |
| *H01L 51/46* | (2006.01) | |
| *H01L 51/48* | (2006.01) | |
| *H01L 31/0352* | (2006.01) | |
| *B82Y 10/00* | (2011.01) | |
| *H01L 27/30* | (2006.01) | |
| *H01L 51/50* | (2006.01) | |

(52) U.S. Cl.
CPC ....... *H01L31/035272* (2013.01); *H01L 51/002* (2013.01); *H01L 51/006* (2013.01); *H01L 51/0046* (2013.01); *H01L 51/0068* (2013.01); *H01L 51/0085* (2013.01); *H01L 51/5048* (2013.01); *H01L 51/5052* (2013.01); *H01L 2251/308* (2013.01); *Y02E 10/549* (2013.01)

(56) References Cited

U.S. PATENT DOCUMENTS

| 8,426,850 | B2 * | 4/2013 | Gresser et al. | 257/40 |
|---|---|---|---|---|
| 8,552,639 | B2 * | 10/2013 | Kim et al. | 313/506 |
| 2005/0061232 | A1 | 3/2005 | Werner et al. | |
| 2005/0110005 | A1 | 5/2005 | Forrest et al. | |
| 2005/0121667 | A1 | 6/2005 | Kuehl et al. | |
| 2005/0139810 | A1 | 6/2005 | Kuehl et al. | |
| 2007/0090371 | A1 | 4/2007 | Drechsel | |
| 2007/0278479 | A1 | 12/2007 | Werner et al. | |
| 2008/0290783 | A1 * | 11/2008 | Tao et al. | 313/498 |
| 2009/0212280 | A1 | 8/2009 | Werner et al. | |
| 2009/0217980 | A1 | 9/2009 | Pfeiffer et al. | |

FOREIGN PATENT DOCUMENTS

| DE | 103 47 856 A1 | 6/2005 |
|---|---|---|
| DE | 103 57 044 A1 | 7/2005 |
| DE | 10 2004 010 954 A1 | 10/2005 |
| DE | 10 2006 053 320 A1 | 5/2008 |
| DE | 10 2006 054 524 A1 | 5/2008 |
| DE | 10 2008 051 737 A1 | 5/2009 |
| EP | 0 000 829 A1 | 2/1979 |
| WO | WO 2004/083958 A2 | 9/2004 |
| WO | WO 2006/092134 A1 | 9/2006 |

OTHER PUBLICATIONS

Christian Uhrich, David Wynands, Selina Olthof, Moritz K. Riede, Karl Leo, Stefan Sonntag, Bert Maennig, and Martin Pfeiffer, "Origin of open circuit voltage in planar and bulk heterojunction organic thin-film photovoltaics depending on doped transport layers" (published Aug. 29, 2008).*

Jan Meiβ "New Material Concepts for Organic Solar Cells" (published May 31, 2010), pp. 71-72.*

A. Barbot, B. Lucas, C. Di Bin, B. Ratier, and M. Aldissi "Optimized inverted polymer solar cells incorporating Cs2CO3-doped C60 as electron transport layer".*

Steffen Pfuetzner, Annette Petrich, Christine Malbrich, Jan Meiss, Maik Koch, Moritz K. Riede, Martin Pfeiffer, and Karl Leo, "Characterisation of different hole transport materials as used in organic p-i-n solar cells", 2008, pp. 1-9.*

Ameri, T., et al., "Organic tandem solar cells: A review," Energy & Environmental Science, vol. 2, 2009, pp. 347-363, The Royal Society of Chemistry.

Hiramoto, M., et al., "Effect of Thin Gold Interstitial-layer on the Photovoltaic Properties of Tandem Organic Solar Cell," Chemistry Letters, 1990, pp. 327-330, The Chemical Society of Japan.

Hiramoto, M., et al., "Organic Solar Cells Incorporating a p-i-n Junction," Molecular Crystals Liquid Crystals Journals, vol. 444, 2006, pp. 33-40, Taylor & Francis, LLC.

Hiramoto, M., et al., "Three-layered organic solar cell with a photoactive interlayer of codeposited pigments," Applied Physics Letters, vol. 58, No. 10, Mar. 11, 1991, pp. 1062-1064, American Institute of Physics.

Pfeiffer, M., "Controlled Doping of Organic Vacuum Deposited Dye Layers: Basics and Applications," Dissertation, PhD thesis for the University of Dresden, 1999, 155 pages.

Schueppel, R., et al., "Controlled current matching in small molecule organic tandem solar cells using doped spacer layers," Journal of Applied Physics, vol. 107, 2010, pp. 044503-1—044503-6, American Institute of Physics.

Tang, C.W., "Two-layer organic photovoltaic cell," Applied Physics Letters, vol. 48, No. 2, Jan. 13, 1986, pp. 183-185, American Institute of Physics.

Uhrich, C., et al., "Origin of open circuit voltage in planar and bulk heterojunction organic thin-film photovoltaics depending on doped transport layers," Journal of Applied Physics, vol. 104, 2008, pp. 043107-1—043107-6, American Institute of Physics.

Yook, K.S., "Highly Efficient p-i-n and Tandem Organic Light-Emitting Devices Using an Air-Stable and Low-Temperature-Evaporable Metal Azide as an n-Dopant," Advanced Functional Materials, vol. 20, Jun. 9, 2010, pp. 1797-1802.

* cited by examiner

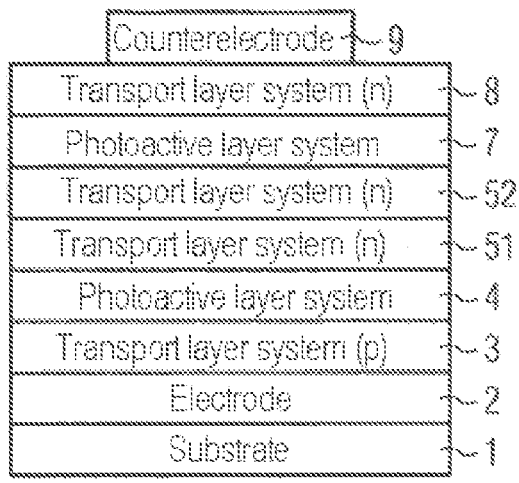
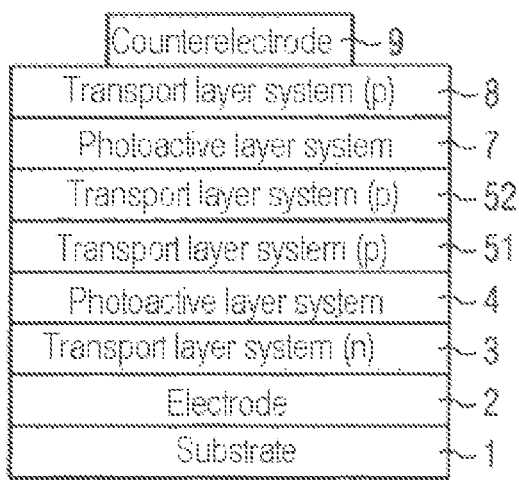

FIG 3

| Counterelectrode | ~9 |
|---|---|
| Transport layer system (n or p) | ~8 |
| Photoactive layer system | ~7 |
| Transport layer system (n or p) | ~62 |
| Transport layer system (n or p) | ~61 |
| Transport layer system (n or p) | ~52 |
| Transport layer system (n or p) | ~51 |
| Photoactive layer system | ~4 |
| Transport layer system (n or p) | ~3 |
| Electrode | ~2 |
| Substrate | ~1 |

FIG 4A

| Counterelectrode | 9 |
| Transport layer system (n) | 8 |
| Photoactive layer system | 7 |
| Transport layer system (p) | 62 |
| Transport layer system (p) | 61 |
| Transport layer system (n) | 52 |
| Transport layer system (n) | 51 |
| Photoactive layer system | 4 |
| Transport layer system (p) | 3 |
| Electrode | 2 |
| Substrate | 1 |

FIG 4B

| Counterelectrode | 9 |
| Transport layer system (p) | 8 |
| Photoactive layer system | 7 |
| Transport layer system (n) | 62 |
| Transport layer system (n) | 61 |
| Transport layer system (p) | 52 |
| Transport layer system (p) | 51 |
| Photoactive layer system | 4 |
| Transport layer system (n) | 3 |
| Electrode | 2 |
| Substrate | 1 |

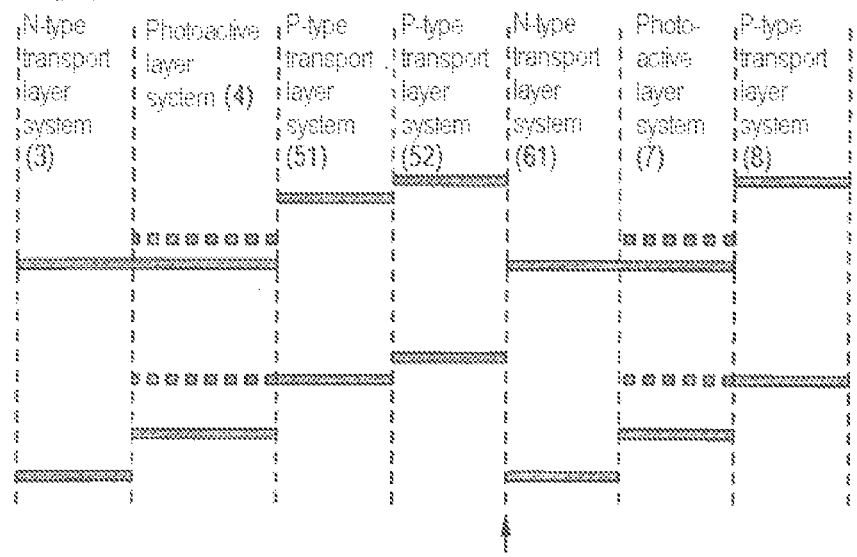

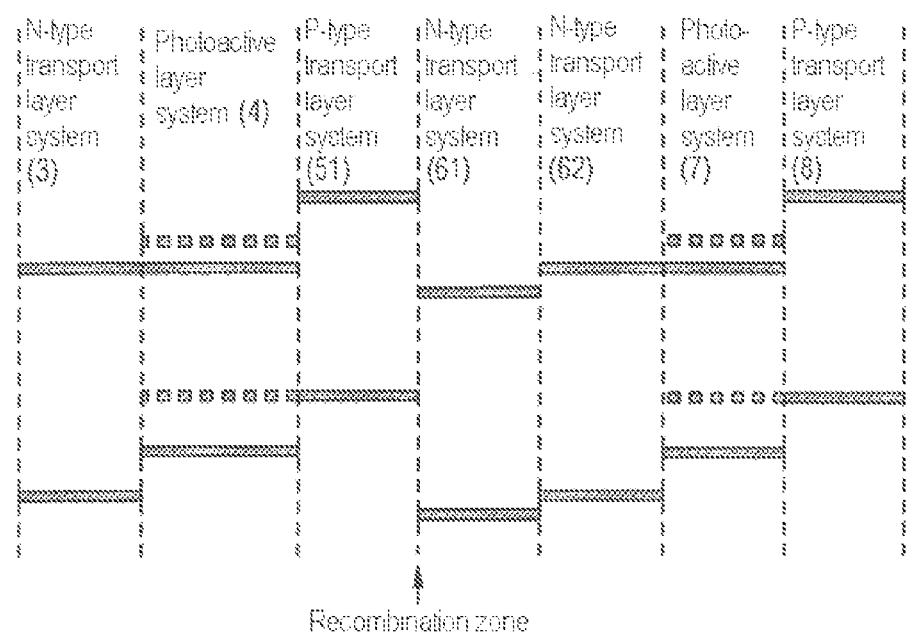

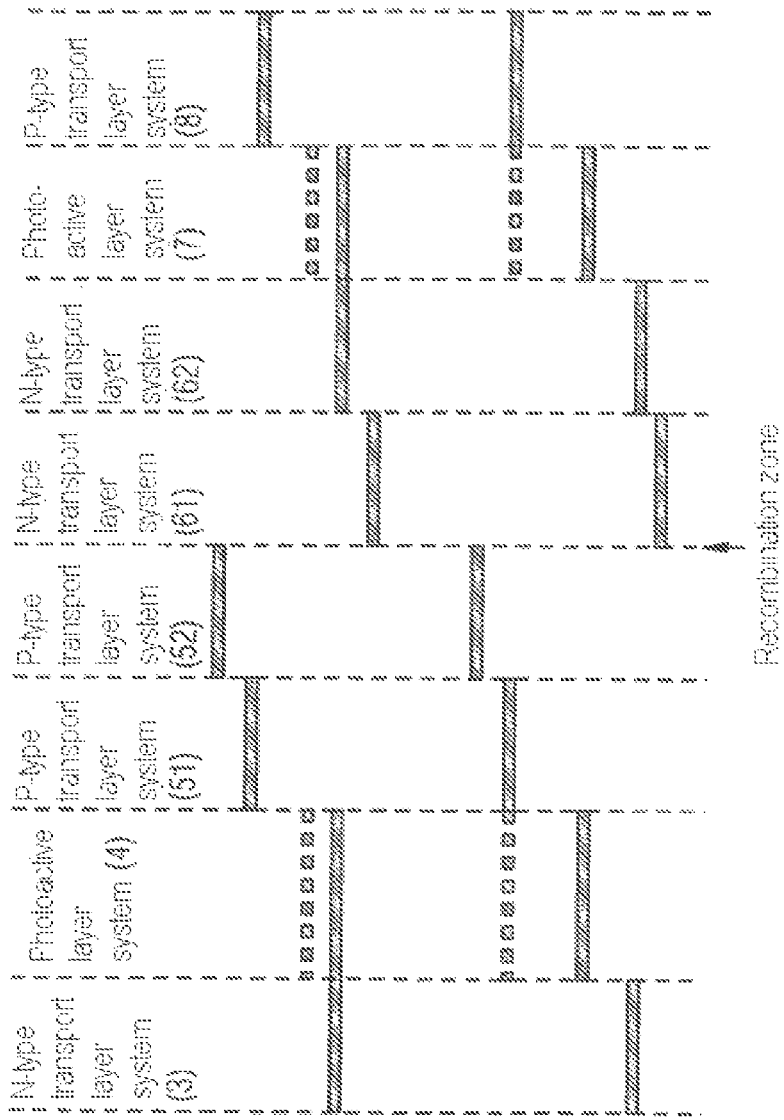

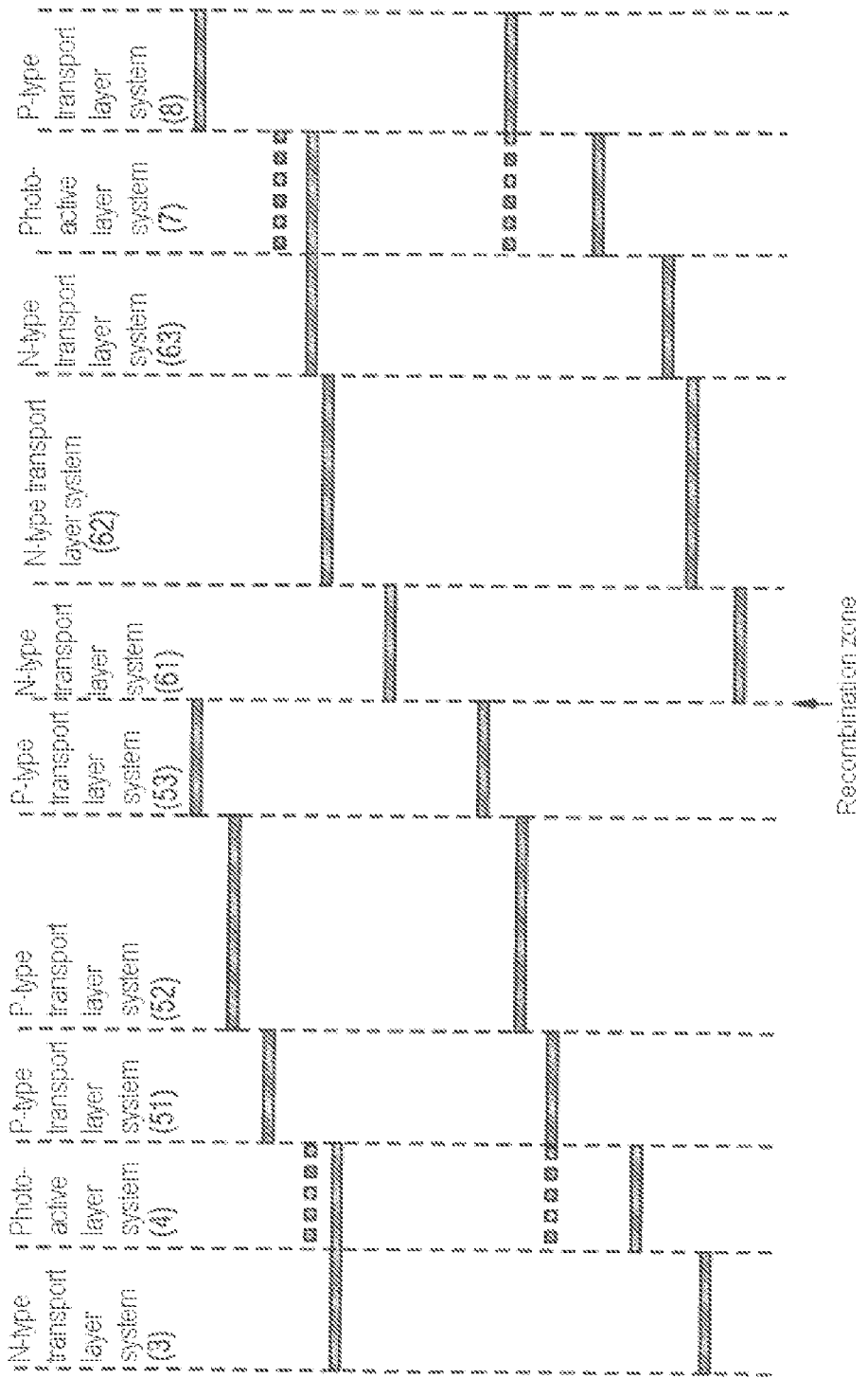

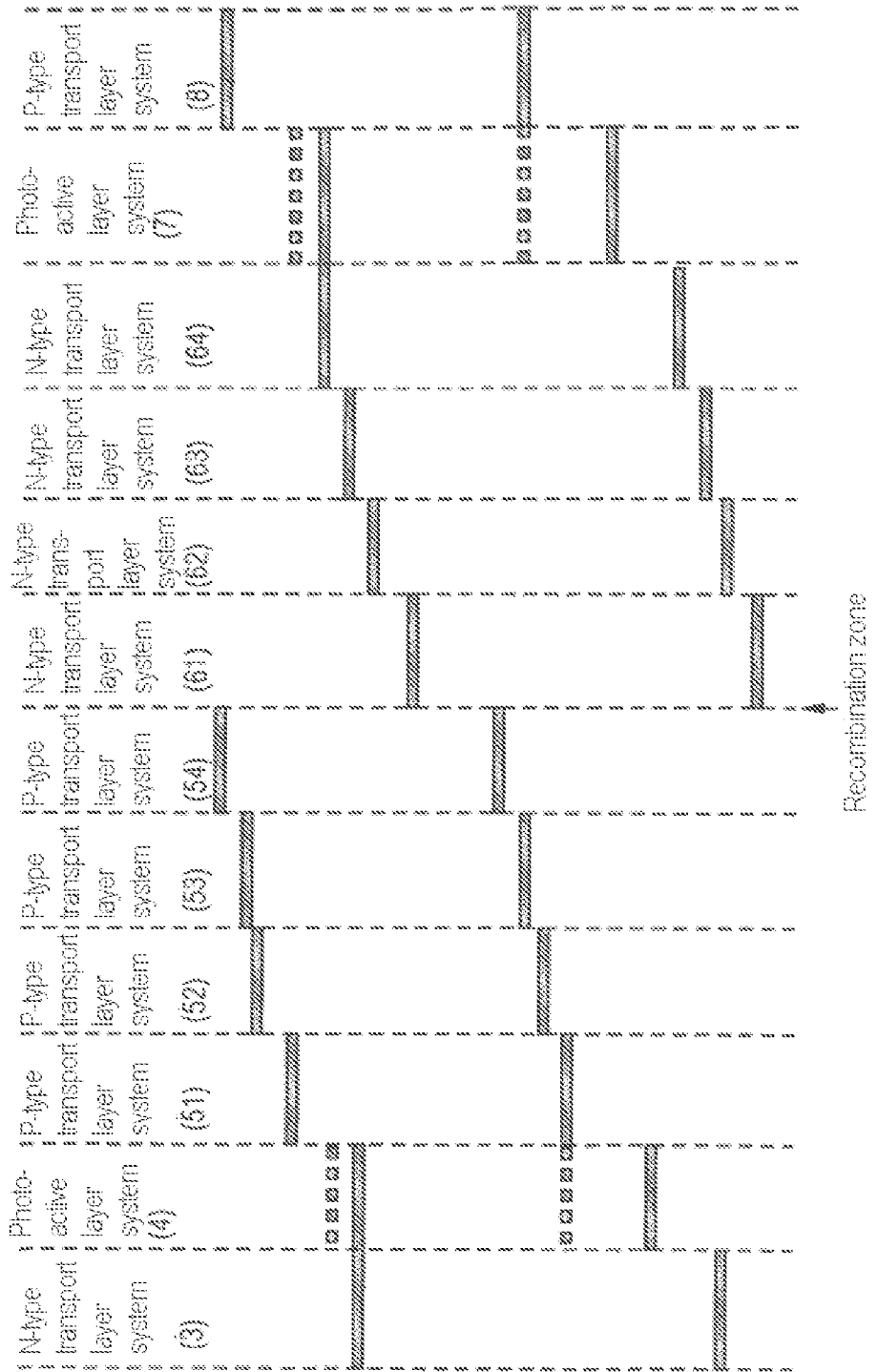

PHOTOACTIVE COMPONENT HAVING A PLURALITY OF TRANSPORT LAYER SYSTEMS

This patent application is a national phase filing under section 371 of PCT/EP2011/060355, filed Jun. 21, 2011, which claims the priority of European patent application 10166619.6, filed Jun. 21, 2010, each of which is incorporated herein by reference in its entirety.

TECHNICAL FIELD

The invention relates to a photoactive component having organic layers, having an electrode and a counterelectrode and, between the electrodes, at least two photoactive layer systems and, between the photoactive layer systems, at least two different transport layer systems of the same charge carrier type, wherein one transport layer system is energetically adapted to one of the two photoactive layer systems and the other transport layer system is embodied in a transparent fashion.

BACKGROUND

Hereinafter, the term "layer system" is defined as follows: a layer system consists of one or more layers, wherein the respective layers can be individual layers or mixed layers. The layer system can thus be an arbitrary combination of individual and mixed layers.

Hereinafter, the term "transport layer system" is defined as follows: a transport layer system is a layer system which transports preferably one type of charge carrier (electrons: n-type transport layer system; holes: p-type transport layer system). In a solar cell, through absorption of light, a transport layer system contributes less than 5% to the short-circuit photocurrent, preferably less than 2%.

Furthermore, the term "different transport layer systems" is defined as follows: two transport layer systems are different if at least one material is contained only in one of the two transport layer systems. If said material is a dopant, then the transport layer systems are different when each transport layer system contains a different dopant.

The term "charge carrier type" is defined as follows: a charge carrier type relates to electrons and holes. In this sense, two transport layer systems are of the same charge carrier type if they both preferably conduct electrons or both preferably conduct holes.

The term "transparent" is defined as a material or a material film or a transport layer system is transparent if at least one of the following conditions is applicable:

The energetic separation between LUMO and HOMO of the material or of the material film or of the transport layer system is >2.5 eV, preferably >3.0 eV.

A 50 nm thick film of the material or of the transport layer system has a transparency of >70% in the wavelength range of 400 nm to 900 nm, preferably >80% or >90%, very preferably >95%.

The material or the material film or the transport layer system has an extinction coefficient $\epsilon$ which does not exceed the value of $0.5 \times 10^5$ cm$^{-1}$ in the wavelength range of between 450 nm and 800 nm, and/or the material or the material film or the transport layer system has an absorption index k which does not exceed the value 0.1 in the wavelength range of between 450 nm and 800 nm (another term for k is also optical constant: the two optical constants are usually designated by n and k).

The material or the material film or the transport layer system has a larger optical band gap than the photoactive layer system (within the meaning of DE 10 2004 014 046).

Transparent organic materials are also designated as wide-gap materials in the literature.

The terms "HOMO" and "LUMO" are understood as highest occupied molecular orbital and lowest unoccupied molecular orbital, as usual in chemistry. The term in this case relates both to individual molecules and to solids or material films. In this case, the energy positions of HOMO and LUMO can be determined, as known to the person skilled in the art, e.g., by means of cyclic voltammetry (CV) or ultraviolet photoelectron spectroscopy (ultraviolet photon spectroscopy UPS).

The term "transport energy level position" is defined as follows: the transport energy level position of a transport layer system is the energetic position of the HOMO if a p-type transport layer system is involved, and is the energetic position of the LUMO if an n-type transport layer system is involved.

Furthermore, the term "energetically adapted" is defined as follows: a transport layer system which preferably conducts electrons (n-type conductor) is energetically adapted to a photoactive layer system if the energy level of the LUMO of the transport layer system differs by less than 0.5 eV from the energy level of the LUMO of the acceptor material of the photoactive layer system. In this case, the energy level of the LUMO of the transport layer system can be either a maximum of 0.5 eV above the energy level of the LUMO of the acceptor material of the photoactive layer system or a maximum of 0.5 eV below. If the photoactive layer system contains a plurality of acceptors, then that acceptor material which has the energetically lowest LUMO is decisive. Preferably, the energy level positions of the LUMOs can also differ only by 0.3 eV, particularly preferably also only by 0.2 eV or only by 0.1 eV, or they can be virtually identical.

Analogously, a transport layer system which preferably conducts holes (p-type conductor) is energetically adapted to a photoactive layer system if the energy level of the HOMO of the transport layer system differs by less than 0.5 eV from the energy level of the HOMO of the donor material of the photoactive layer system. In this case, the energy level of the HOMO of the transport layer system can be either a maximum of 0.5 eV above the energy level of the HOMO of the donor material of the photoactive layer system or a maximum of 0.5 eV below. If the photoactive layer system contains a plurality of donors, then that donor material which has the energetically highest HOMO is decisive. Preferably, the energy level positions of the HOMOs can also differ only by 0.3 eV, very preferably also only by 0.2 eV or only by 0.1 eV, or can be virtually or exactly identical.

Possibilities for adapting the LUMO levels or the HOMO levels are known to the person skilled in the art, wherein very many organic materials having different positions of the energy levels of the HOMOs and LUMOs are known. The adaptation is therefore effected in such a way that a material which has the desired position of the energy levels of the HOMO and LUMO is selected and used. Furthermore, e.g., by incorporating electron-attracting or electron-repelling groups, the HOMO and LUMO levels of organic materials can be decreased or increased and a material can thus be adapted in accordance with the requirements.

In the context of this application, the term "readily dopable" is defined as follows: a hole transport material (p-type transport material) or a hole transport layer system (p-type transport layer system) is designated as readily dopable if the energy level of its HOMO is greater than or equal to −5.5 eV.

The term "greater" (or else "higher") here relates to the numerical value, i.e., −5.4 eV is greater (higher) than −5.5 eV. Preferably, the energy level of the HOMO is in the range of −5.2 eV to −4.9 eV. Analogously, an electron transport material (n-type transport material) or an electron transport layer system (n-type transport layer system) is designated as readily dopable if the energy level of the LUMO is less than or equal to −3.0 eV. The term "less" (or else "lower") here relates to the numerical value, i.e., −3.1 eV is less (lower) than −3.0 eV. Preferably, the energy level of the LUMO is in the range of −3.5 eV to −4.5 eV.

Since the demonstration of the first organic solar cell having an efficiency in the percent range by Tang, et al., 1986 [C. W. Tang, et al., Appl. Phys. Lett. 48, 183 (1986)], organic materials have been investigated intensively for various electronic and optoelectronic components. Organic solar cells consist of a sequence of thin layers (typically 1 nm to 1 μm) composed of organic materials, which are preferably applied by vapor deposition in a vacuum or by spin-coating from a solution. The electrical contact-connection can be effected by metal layers, transparent conductive oxides (TCOs) and/or transparent conductive polymers (PEDOT-PSS, PANI).

A solar cell converts light energy into electrical energy. In this case, the term photoactive likewise denotes the conversion of light energy into electrical energy. In contrast to inorganic solar cells, in organic solar cells the light does not directly generate free charge carriers, rather excitons initially form, that is to say electrically neutral excitation states (bound electron-hole pairs). It is only in a second step that these excitons are separated into free charge carriers which then contribute to the electric current flow.

The advantage of such organic-based components over the conventional inorganic-based components (semiconductors such as silicon, gallium arsenide) are the in some instances extremely high optical absorption coefficients (up to $2 \times 10^5$ cm$^{-1}$), thus affording the possibility of producing very thin solar cells with little outlay in terms of material and energy. Further technological aspects include the low costs, the possibility of producing flexible large-area components on plastic films, and the virtually unlimited possibilities for variation and the unlimited availability of organic chemistry.

One possibility for the realization of an organic solar cell that has already been proposed in the literature consists in a pin diode [Martin Pfeiffer, "Controlled doping of organic vacuum deposited dye layers: basics and applications," PhD thesis TU-Dresden, 1999] having the following layer construction:

0. carrier, substrate,
1. bottom contact, normally transparent,
2. p-layer(s),
3. i-layer(s),
4. n-layer(s),
5. top contact.

In this case, n and p denote an n-type and p-type doping, respectively, which lead to an increase in the density of free electrons and holes, respectively, in the thermal equilibrium state. However, it is also possible for the n-layer(s) and p-layer(s) to be at least in part nominally undoped and to have preferably n-conducting and preferably p-conducting properties, respectively, only on account of the material properties (e.g., different mobilities), on account of unknown impurities (e.g., residual residues from the synthesis, decomposition or reaction products during the layer production) or on account of influences of the surroundings (e.g., adjacent layers, indiffusion of metals or other organic materials, gas doping from the surrounding atmosphere). In this sense, layers of this type should primarily be understood as transport layers. By contrast, the designation i-layer denotes a nominally undoped layer (intrinsic layer). In this case, one or a plurality of i-layers can consist either of one material, or of a mixture composed of two materials (so-called interpenetrating networks or bulk heterojunctions; M. Hiramoto, et al., Mol. Cryst. Liq. Cryst., 2006, 444, pp. 33-40). The light incident through the transparent bottom contact generates excitons (bound electron-hole pairs) in the i-layer or in the n-/p-layer. Said excitons can only be separated by very high electric fields or at suitable interfaces. Sufficiently high fields are not available in organic solar cells, with the result that all promising concepts for organic solar cells are based on the separation of excitons at photoactive interfaces. The excitons pass by diffusion to such an active interface, where electrons and holes are separated from one another. In this case, the material which takes up the electrons is designated as acceptor, and the material which takes up the hole is designated as donor. The separating interface can lie between the p-(n-) layer and the i-layer or between two i-layers. In the built-up electric field of the solar cell, the electrons are then transported away to the n-region and the holes to the p-region. Preferably, the transport layers are transparent or largely transparent materials having a large band gap (wide-gap) such as are described, e.g., in WO 2004/083958. In this case, the term wide-gap materials denotes materials whose absorption maximum lies in the wavelength range of <450 nm, and is preferably <400 nm.

Since the light always generates excitons first, and does not yet generate free charge carriers, the diffusion of excitons to the active interface with little recombination plays a critical part in organic solar cells. In order to make a contribution to the photocurrent, it is necessary, therefore, in a good organic solar cell, for the exciton diffusion length to distinctly exceed the typical penetration depth of the light, in order that the predominant part of the light can be utilized. Organic crystals or thin layers that are perfect structurally and with regard to chemical purity do indeed fulfill this criterion. For large-area applications, however, the use of monocrystalline organic materials is not possible and the production of multilayers with sufficient structural perfection is still very difficult to date.

If the i-layer is a mixed layer, then the task of light absorption is undertaken by either only one of the components or else both. The advantage of mixed layers is that the excitons generated only have to cover a very short path until they reach a domain boundary, where they are separated. The electrons and holes are respectively transported away separately in the respective materials. Since the materials are in contact everywhere with one another in the mixed layer, what is crucial in the case of this concept is that the separated charges have a long lifetime on the respective material and closed percolation paths for both types of charge carriers toward the respective contact are present from every location.

U.S. Pat. No. 5,093,698 discloses the doping of organic materials. By admixing an acceptor-like or donor-like doping substance, the equilibrium charge carrier concentration in the layer is increased and the conductivity is increased. According to U.S. Pat. No. 5,093,698, the doped layers are used as injection layers at the interface with respect to the contact materials in electroluminescent components. Similar doping approaches are analogously expedient for solar cells as well.

The literature discloses various possibilities for realization for the photoactive i-layer. Thus, the latter can be a double layer (EP 0000829) or a mixed layer (Hiramoto, Appl. Phys. Lett. 58, 1062 (1991)). A combination of double and mixed layers is also known (Hiramoto, Appl. Phys. Lett. 58, 1062 (1991); U.S. Pat. No. 6,559,375). It is likewise known that the mixing ratio differs in different regions of the mixed layer (U.S. 2005/0110005), or the mixing ratio has a gradient.

Furthermore, the construction and the formation of tandem and multiple solar cells are known from the literature (Hiramoto, Chem. Lett., 1990, 327 (1990); DE 10 2004 014 046). Specifically, the construction and the function of the recombination region in the tandem cells is also described in DE 10 2004 014 046.

Furthermore, the literature discloses organic pin-tandem cells (DE 10 2004 014 046): the structure of such a tandem cell consists of two pin single cells, wherein the layer sequence "pin" describes the succession of a p-doped layer system, an undoped photoactive layer system and an n-doped layer system. The doped layer systems preferably consist of transparent materials, so-called wide-gap materials/layers, and in this case they can also be partly or wholly undoped or else have in a location-dependent manner different doping concentrations or have a continuous gradient in the doping concentration. Especially even very lightly doped or highly doped regions in the boundary region at the electrodes, in the boundary region with respect to some other doped or undoped transport layer, in the boundary region with respect to the active layers or in the case of tandem or multiple cells in the boundary region with respect to the adjacent pin- or nip-subcell, i.e., in the region of the recombination zone, are possible. Any desired combination of all these features is also possible. Of course, such a tandem cell can also be a so-called inverted structure (e.g., nip-tandem cell). All these possible forms of realization for tandem cells are designated by the term pin-tandem cells hereinafter.

Within the meaning of the present invention, small molecules are understood to be non-polymeric organic molecules having monodisperse molar masses of between 100 and 2000 which are present in a solid phase under normal pressure (air pressure of the atmosphere surrounding us) and at room temperature. In particular, these small molecules can also be photoactive, wherein photoactive is understood to mean that the molecules change their charge state under light incidence.

The problem of organic solar cells at the present time is that even the highest efficiencies of 7-8% achieved hitherto in the laboratory are still too low. For most applications, especially large-area applications, an efficiency of approximately 10% is deemed to be necessary. On account of the poorer transport properties of organic semiconductors (in comparison with inorganic semiconductors) and the associated limited layer thicknesses of the absorbers that can be used in organic solar cells, it is generally assumed that such efficiencies can most likely be realized with the aid of tandem cells (Tayebeh Ameri, et al., Organic tandem solar cells: A review, Energy Environ. Sci., 2009, 2, 347-363; DE 10 2004 014 046). Especially efficiencies of up to 15% will in the future probably only be possible with the aid of tandem cells.

The disadvantage of the previously known tandem cells is that only one transport layer system of one charge carrier type is used between two photoactive layer systems (also designated hereinafter as absorber systems or absorber layer systems). The disadvantage in this respect is that this one transport layer system has to be energetically well adapted to an absorber system (in order to enable an efficient extraction of the charge carriers from the absorber system and, e.g., not to form an energy barrier for the charge carriers) and, on the other hand, is intended to be transparent as well as possible (in order not to form parasitic absorption) and is intended to have the best possible charge carrier transport properties. The previously known materials normally fulfill only one of these properties actually satisfactorily and use is often made of a compromise material which fulfills both properties reasonably well to satisfactorily. If a thick transport layer system is required for optical reasons, there is additionally often the problem that the material used does not have a sufficient conductivity and, consequently, the component is limited in terms of its properties (efficiency, filling factor, voltage) on account of the series resistance formed. In some instances, this problem is attempted to be solved by choosing a higher doping concentration. However, these attempted solutions have only a limited success and, as a result of the higher use of dopant materials, the production process for the components is made more expensive, which impedes commercial utilization.

The use of two different transport layer systems instead of the one transport layer system used previously is of great technical importance. The entire transport layer region between the photoactive layer systems has to fulfill a number of functions, namely to achieve a good to as far as possible virtually perfect energetic adaptation, to have as far as possible very good transport properties, to be as far as possible completely transparent and, furthermore, also to be thermally and mechanically stable. Perfectly combining all these properties in only one material for one charge carrier type is virtually impossible. In the previous prior development of organic solar cells, this problem has evidently not yet become clear, since the previous solar cells have been able to be realized with an efficiency of 6-8% even with a material which does not fulfill all properties well to very well. For commercial utilization, however, efficiencies of 10-12% and beyond are absolutely necessary. In order to achieve these high efficiencies, all loss mechanisms within the solar cell structure must be eliminated. One very important building block in this regard is that the transport layer region between the photoactive layer systems in tandem or multiple cells virtually perfectly satisfies the requirements imposed. As explained above, this is practically and technically achievable only if at least two different transport layer systems of the same charge carrier type are used.

SUMMARY OF THE INVENTION

In one aspect, the present invention specifies an organic photoactive component that overcomes the disadvantages presented.

The component according to the invention, which is embodied as a tandem or multiple cell, has an electrode and a counterelectrode and, between the electrodes, at least one organic layer system and furthermore at least two photoactive layer systems and, between the photoactive layer systems, at least two different transport layer systems of the same charge carrier type, wherein one transport layer system is energetically adapted to one of the two photoactive layer systems and the other transport layer system is embodied in a transparent fashion.

In one embodiment of the invention, the transparent transport layer system has a conductivity of $>1\times10^{-6}$ S/cm and/or is doped.

In one embodiment of the invention, both transport layer systems directly adjoin one another and/or both are transparent.

In one embodiment of the invention, one or both transport layer systems consists or consist of at least one organic material. Preferably, the transport layer systems consist of organic materials.

In one embodiment of the invention, one or both transport layer systems has or have a high intrinsic mobility of the charge carriers. In this case, the term intrinsic means nominally undoped, that is to say that the intrinsic mobility of the charge carriers of a material is that mobility if the material is undoped.

In one embodiment of the invention, the transport energy level positions (HOMO and LUMO) of the transparent transport layer system are such that the latter can be well doped.

In one embodiment of the invention, at least one transport layer system is energetically adapted to one of the two photoactive layer systems: a transport layer system which preferably conducts electrons (n-type conductor) is energetically adapted to a photoactive layer system if the energy level of the LUMO of the transport layer system differs by less than 0.5 eV from the energy level of the LUMO of the acceptor material of the photoactive layer system. In this case, the energy level of the LUMO of the transport layer system can be either a maximum of 0.5 eV above the energy level of the LUMO of the acceptor material of the photoactive layer system or a maximum of 0.5 eV below. If the photoactive layer system contains a plurality of acceptors, then that acceptor material which has the energetically lowest LUMO is decisive. Preferably, the energy level positions of the LUMOs can also differ only by 0.3 eV, particularly preferably also only by 0.2 eV or only by 0.1 eV, or they can be virtually identical.

Analogously, a transport layer system which preferably conducts holes (p-type conductor) is energetically adapted to a photoactive layer system if the energy level of the HOMO of the transport layer system differs by less than 0.5 eV from the energy level of the HOMO of the donor material of the photoactive layer system. In this case, the energy level of the HOMO of the transport layer system can be either a maximum of 0.5 eV above the energy level of the homo of the donor material of the photoactive layer system or a maximum of 0.5 eV below. If the photoactive layer system contains a plurality of donors, then that donor material which has the energetically highest HOMO is decisive. Preferably, the energy level positions of the HOMOs can also differ only by 0.3 eV, very preferably also only by 0.2 eV or only by 0.1 eV, or can be virtually or exactly identical.

In one embodiment of the invention, the energy level of the LUMO of an n-type transport layer system (n-type conductor) is virtually or exactly identical to the energy level of the LUMO of the acceptor material of the photoactive layer system. This specific embodiment has the advantage that the electrons can leave the photoactive layer system in a barrier-free fashion and no loss in the open-circuit voltage of the component occurs.

In one embodiment of the invention, the energy level of the LUMO of an n-type transport layer system (n-type conductor) is a maximum of 0.5 eV, preferably a maximum of 0.3 eV, very preferably a maximum of 0.2 eV or 0.1 eV or 0.05 eV lower than the energy level of the LUMO of the acceptor material of the photoactive layer system. This specific embodiment has the advantage that the electrons energetically preferably reach the lower LUMO of the n-type transport layer system and the electrons are therefore transported away efficiently.

In one embodiment of the invention, the energy level of the LUMO of an n-type transport layer system (n-type conductor) is a maximum of 0.5 eV, preferably a maximum of 0.3 eV, very preferably a maximum of 0.2 eV or 0.1 eV or 0.05 eV higher than the energy level of the LUMO of the acceptor material of the photoactive layer system. This specific embodiment has the advantage that, as a result of the higher LUMO of the n-type transport layer system, the incorporated field within the solar cell is greater and the electrons are therefore transported away efficiently.

In one embodiment of the invention, the energy level of the HOMO of a p-type transport layer system (p-type conductor) is virtually or exactly identical to the energy level of the HOMO of the donor material of the photoactive layer system. This specific embodiment has the advantage that the holes can leave the photoactive layer system in a barrier-free fashion and no loss in the open-circuit voltage of the component occurs.

In one embodiment of the invention, the energy level of the HOMO of a p-type transport layer system (p-type conductor) is a maximum of 0.5 eV, preferably a maximum of 0.3 eV, very preferably a maximum of 0.2 eV or 0.1 eV or 0.05 eV lower than the energy level of the HOMO of the donor material of the photoactive layer system. This specific embodiment has the advantage that, as a result of the lower HOMO of the p-type transport layer system, the incorporated field within the solar cell is greater and the holes are therefore transported away efficiently.

In one embodiment of the invention, the energy level of the HOMO of a p-type transport layer system (p-type conductor) is a maximum of 0.5 eV, preferably a maximum of 0.3 eV, very preferably a maximum of 0.2 eV or 0.1 eV or 0.05 eV higher than the energy level of the HOMO of the donor material of the photoactive layer system. This specific embodiment has the advantage that the holes energetically preferably reach the higher HOMO of the p-type transport layer system and the holes are therefore transported away efficiently.

In one embodiment of the invention, one or both transport layer systems is or are individual layers or mixed layers, wherein the latter are undoped or partly doped or completely doped and the doping has a gradient and/or the doping has different concentrations within the layer. In one embodiment of the invention, the two transport layer systems are doped with different dopants.

In one embodiment of the invention, a further transport layer system of the other charge carrier type is also present between the photoactive layer systems.

In one embodiment of the invention, two further transport layer systems of the other charge carrier type are also present between the photoactive layer systems, wherein one transport layer system is energetically adapted to the other (in comparison with the transport layer system) photoactive layer system and the second transport layer system is transparent.

In one embodiment of the invention, one or both of the further transport layer systems is or are embodied as individual or mixed layers. Furthermore, the transport layer systems can be undoped, partly doped or completely doped, wherein the doping has a gradient or the doping varies spatially and/or the transport layer systems are provided with different dopants.

In one embodiment of the invention, one or more further undoped, partly doped or completely doped layers or mixed layers composed of inorganic materials, organic materials, small molecules, polymers, metals, metal oxides, salts or a conductive oxide are also present between the photoactive layer systems.

In one embodiment of the invention, different materials are present in at least two photoactive layer systems. Preferably, the photoactive layer systems absorb in different wavelength ranges of the solar spectrum.

In one embodiment of the invention, at least two transport layer systems are present between the photoactive layer system and the electrode and/or between the photoactive layer system and the counterelectrode, wherein one transport layer system is energetically adapted to the respective photoactive layer system, wherein the second transport layer system is transparent.

In one embodiment of the invention, at least three transport layer systems are present between the photoactive layer system and the electrode and/or between the photoactive layer system and the counterelectrode, wherein one transport layer system is energetically adapted to the respective photoactive layer system, the second transport layer system is transparent and the third transport layer system is energetically adapted to the electrode or counterelectrode.

In one embodiment of the invention, the transport layer systems present in the component, independently of one another, are embodied as individual layers or mixed layers or in a manner consisting of nanoclusters. Furthermore, the transport layer systems are embodied as transparent or semi-transparent. In this case, the latter can be undoped, partly doped or completely doped, wherein the doping can have a gradient or the doping can vary spatially. Furthermore, the transport layer systems can be doped more highly at the electrodes or in a region at a distance of up to 30 nm from the electrodes and/or the transport layer systems can be doped with different dopants.

In a further embodiment of the invention, the component consists of a combination of nip, ni, ip, pnip, pni, pip, nipn, nin, ipn, pnipn, pnin or pipn structures, in which a plurality of independent combinations containing at least one i-layer are stacked one above another.

In further embodiments of the invention, the component can have the following layer orders, wherein p denotes p-type transport layer system, n denotes n-type transport layer system and i denotes photoactive layer system:

electrode/pinnin/counterelectrode
electrode/nippip/counterelectrode
electrode/pinnpin/counterelectrode
electrode/nippnip/counterelectrode
electrode/pinppin/counterelectrode
electrode/nipnnip/counterelectrode
electrode/pinnppin/counterelectrode
electrode/nippnnip/counterelectrode
electrode/pinnnin/counterelectrode
electrode/nipppip/counterelectrode
electrode/pinnnpin/counterelectrode
electrode/nipppnip/counterelectrode
electrode/pinpppin/counterelectrode
electrode/nipnnnip/counterelectrode
electrode/pinnnppin/counterelectrode
electrode/nipppnnip/counterelectrode
electrode/pinppppin/counterelectrode
electrode/nipnnnnip/counterelectrode
electrode/pinnnpppin/counterelectrode
electrode/nippppnnip/counterelectrode
electrode/pinnnnin/counterelectrode
electrode/nippppip/counterelectrode
electrode/pinnnnpin/counterelectrode
electrode/nippppnip/counterelectrode
electrode/pinppppin/counterelectrode
electrode/nipnnnnip/counterelectrode
electrode/pinnnnppin/counterelectrode
electrode/nippppnnip/counterelectrode
electrode/pinnppppin/counterelectrode
electrode/nipppnnnip/counterelectrode
electrode/pinnnpppin/counterelectrode
electrode/nippppnnnip/counterelectrode
electrode/pinnnppppin/counterelectrode
electrode/nippppnnnnip/counterelectrode Of course, 5, 6 or more transport layer systems of the same charge carrier type can also be present one after another. In further embodiments of the invention, the component can furthermore have the following layer orders:

electrode/ppinnin/counterelectrode
electrode/nnippip/counterelectrode
electrode/ppinnpin/counterelectrode
electrode/nnippnip/counterelectrode
electrode/ppinppin/counterelectrode
electrode/nnipnnip/counterelectrode
electrode/ppinnppin/counterelectrode
electrode/nnippnnip/counterelectrode
electrode/ppinnnin/counterelectrode
electrode/nnipppip/counterelectrode
electrode/ppinnnpin/counterelectrode
electrode/nnipppnip/counterelectrode
electrode/ppinppppin/counterelectrode
electrode/nnipnnnip/counterelectrode
electrode/ppinnnppin/counterelectrode
electrode/nnipppnnip/counterelectrode
electrode/ppinppppin/counterelectrode
electrode/nnipnnnnip/counterelectrode
electrode/ppinnnpppin/counterelectrode
electrode/nnippppnnip/counterelectrode
electrode/ppinnnnin/counterelectrode
electrode/nnippppip/counterelectrode
electrode/ppinnnnpin/counterelectrode
electrode/nnippppnip/counterelectrode
electrode/ppinnppppin/counterelectrode
electrode/nipnnnnnip/counterelectrode
electrode/ppinnnnppin/counterelectrode
electrode/nnippppnnip/counterelectrode
electrode/ppinnppppin/counterelectrode
electrode/nnippppnnip/counterelectrode
electrode/ppinnnnppppin/counterelectrode
electrode/nnippppnnnip/counterelectrode
electrode/ppinnnppppin/counterelectrode
electrode/nnippppnnnnip/counterelectrode
electrode/ppinnnnppppin/counterelectrode
electrode/nnippppnnnnip/counterelectrode
electrode/pinninn/counterelectrode
electrode/nippipp/counterelectrode
electrode/pinnpinn/counterelectrode
electrode/nippnipp/counterelectrode
electrode/pinppinn/counterelectrode
electrode/nipnnipp/counterelectrode
electrode/pinnppinn/counterelectrode
electrode/nippnnipp/counterelectrode
electrode/pinnninn/counterelectrode
electrode/nipppipp/counterelectrode
electrode/pinnnpinn/counterelectrode
electrode/nipppnipp/counterelectrode
electrode/pinppppinn/counterelectrode
electrode/nipnnnipp/counterelectrode
electrode/pinnnppinn/counterelectrode
electrode/nipppnnipp/counterelectrode
electrode/pinppppinn/counterelectrode
electrode/nipnnnnipp/counterelectrode
electrode/pinnnpppinn/counterelectrode
electrode/nippppnnipp/counterelectrode
electrode/pinnnninn/counterelectrode
electrode/nippppipp/counterelectrode
electrode/pinnnnpinn/counterelectrode
electrode/nippppnipp/counterelectrode
electrode/pinppppinn/counterelectrode
electrode/nipnnnnipp/counterelectrode
electrode/pinnnnppinn/counterelectrode
electrode/nippppnnipp/counterelectrode
electrode/pinnppppinn/counterelectrode
electrode/nipppnnnipp/counterelectrode
electrode/pinnnppppinn/counterelectrode
electrode/nippppnnnipp/counterelectrode
electrode/pinnnppppinn/counterelectrode
electrode/nippppnnnipp/counterelectrode
electrode/pinnnnppppinn/counterelectrode
electrode/nippppnnnnipp/counterelectrode
electrode/pppinnin/counterelectrode
electrode/nnnippip/counterelectrode
electrode/pppinnpin/counterelectrode
electrode/nnnippnip/counterelectrode
electrode/pppinppin/counterelectrode electrode/nnnipnnnip/counterelectrode
electrode/pppinnnppin/counterelectrode
electrode/nnnippnnnip/counterelectrode
electrode/pppinnnnin/counterelectrode
electrode/nnnipppppip/counterelectrode
electrode/pppinnnnnip/counterelectrode
electrode/nnnipppnnip/counterelectrode
electrode/pppinpppin/counterelectrode
electrode/nnnipnnnnip/counterelectrode
electrode/pppinnnppin/counterelectrode
electrode/nnnipppnnip/counterelectrode
electrode/pppinnnpppin/counterelectrode
electrode/nnnippnnnip/counterelectrode
electrode/pppinnnpppin/counterelectrode
electrode/nnnipppnnnip/counterelectrode
electrode/pppinnnnin/counterelectrode
electrode/nnnipppppip/counterelectrode
electrode/pppinppppin/counterelectrode
electrode/nnnippppnip/counterelectrode
electrode/pppinppppin/counterelectrode
electrode/nnnipnnnip/counterelectrode
electrode/pppinnnnppin/counterelectrode
electrode/nnnippppnnip/counterelectrode
electrode/pppinppppin/counterelectrode
electrode/nnnippnnnip/counterelectrode
electrode/pppinnnpppin/counterelectrode
electrode/nnnippppnnip/counterelectrode
electrode/pppinnnppppin/counterelectrode
electrode/nnnippppnnnip/counterelectrode
electrode/pppinnnnpppin/counterelectrode
electrode/nnnippppnnnip/counterelectrode
electrode/pppinnnnppppin/counterelectrode
electrode/nnnippppnnnnip/counterelectrode
electrode/pinninnn/counterelectrode
electrode/nippippp/counterelectrode
electrode/pinnpinn/counterelectrode
electrode/nippnipp/counterelectrode
electrode/pinppinn/counterelectrode
electrode/nipnnipp/counterelectrode
electrode/pinppinnn/counterelectrode
electrode/nippnnipp/counterelectrode
electrode/pinnninnn/counterelectrode
electrode/nippipppp/counterelectrode
electrode/pinnnpinnn/counterelectrode
electrode/nipppnippp/counterelectrode
electrode/pinppinnn/counterelectrode
electrode/nipnnnippp/counterelectrode
electrode/pinnpppinnn/counterelectrode
electrode/nippnnippp/counterelectrode
electrode/pinnnpppinnn/counterelectrode
electrode/nippnnnippp/counterelectrode
electrode/pinnninnn/counterelectrode
electrode/nippppippp/counterelectrode
electrode/pinnnnpinnn/counterelectrode
electrode/nippppippp/counterelectrode
electrode/pinppppinnn/counterelectrode
electrode/nipnnnnippp/counterelectrode
electrode/pinnnnppinnn/counterelectrode
electrode/nipppnnippp/counterelectrode
electrode/pinnppppinnn/counterelectrode
electrode/nipnnnnippp/counterelectrode
electrode/pinnnnppppinnn/counterelectrode
electrode/nippppnnippp/counterelectrode
electrode/pinnppppinnn/counterelectrode
electrode/nipppnnnippp/counterelectrode
electrode/pinnnnppppinnn/counterelectrode
electrode/nippppnnnippp/counterelectrode
electrode/ppinninn/counterelectrode
electrode/nnippipp/counterelectrode
electrode/ppinnpinn/counterelectrode
electrode/nnippnipp/counterelectrode
electrode/ppinpinn/counterelectrode
electrode/nnipnnipp/counterelectrode
electrode/ppinnppin/counterelectrode
electrode/nnippnnipp/counterelectrode
electrode/ppinnninn/counterelectrode
electrode/nnipppipp/counterelectrode
electrode/ppinnpinn/counterelectrode
electrode/nnipppnipp/counterelectrode
electrode/ppinppinn/counterelectrode
electrode/nnipnnnipp/counterelectrode
electrode/ppinnppinn/counterelectrode
electrode/nnipppnipp/counterelectrode
electrode/ppinnpppinn/counterelectrode
electrode/nnipppnnipp/counterelectrode electrode/nnipppnnnipp/counterelectrode
electrode/ppinnnninn/counterelectrode
electrode/nnippppipp/counterelectrode
electrode/ppinnnnpinn/counterelectrode
electrode/nnipppppnipp/counterelectrode
electrode/ppinppppinn/counterelectrode
electrode/nnipnnnnipp/counterelectrode
electrode/ppinnnnppinn/counterelectrode
electrode/nnippppnnipp/counterelectrode
electrode/ppinnppppinn/counterelectrode
electrode/nnippnnnnipp/counterelectrode
electrode/ppinnnnpppinn/counterelectrode
electrode/nnippppppipp/counterelectrode
electrode/ppinnnppppinn/counterelectrode
electrode/nnipppnnnipp/counterelectrode
electrode/ppinnnnpppppinn/counterelectrode
electrode/nnippppnnnipp/counterelectrode
electrode/pppinninn/counterelectrode
electrode/nnnippipp/counterelectrode
electrode/pppinnpinn/counterelectrode
electrode/nnnippnipp/counterelectrode
electrode/pppinppinn/counterelectrode
electrode/nnnipnnipp/counterelectrode
electrode/pppinnppinn/counterelectrode
electrode/nnnippnnipp/counterelectrode
electrode/pppinnnipp/counterelectrode
electrode/nnnipppipp/counterelectrode
electrode/pppinnpinn/counterelectrode
electrode/nnnipppnipp/counterelectrode
electrode/pppinppinn/counterelectrode
electrode/nnnipnnnipp/counterelectrode
electrode/pppinnppinn/counterelectrode
electrode/nnnipppnipp/counterelectrode
electrode/pppinppppinn/counterelectrode
electrode/nnnipnnnipp/counterelectrode
electrode/pppinnnpppinn/counterelectrode
electrode/nnnippppipp/counterelectrode
electrode/pppinnnnipp/counterelectrode
electrode/nnnippppipp/counterelectrode
electrode/pppinnnnpinn/counterelectrode
electrode/nnnippppnipp/counterelectrode
electrode/pppinppppinn/counterelectrode
electrode/nnnipnnnipp/counterelectrode
electrode/pppinnnnppinn/counterelectrode
electrode/nnnippppnipp/counterelectrode
electrode/pppinnppppinn/counterelectrode
electrode/nnnipnnnnipp/counterelectrode
electrode/pppinnnnpppinn/counterelectrode
electrode/nnnippppnnipp/counterelectrode
electrode/pppinnnppppinn/counterelectrode
electrode/nnnipppnnnipp/counterelectrode
electrode/pppinnnnppppinn/counterelectrode
electrode/nnnippppnnnipp/counterelectrode
electrode/ppinnnnn/counterelectrode
electrode/nnipppp/counterelectrode
electrode/ppinnpinnn/counterelectrode
electrode/nnippnippp/counterelectrode
electrode/ppinppinnn/counterelectrode
electrode/nnipnnippp/counterelectrode
electrode/ppinnppinnn/counterelectrode
electrode/nnippnnippp/counterelectrode
electrode/ppinnnnnn/counterelectrode
electrode/nnipppippp/counterelectrode
electrode/pppinnpinnn/counterelectrode
electrode/nnnipppippp/counterelectrode
electrode/ppinppppinn/counterelectrode
electrode/nnnipnnnipppp/counterelectrode
electrode/nnnipnnnnippp/counterelectrode
electrode/pppinnnppppinn/counterelectrode
electrode/nnnipppnnippp/counterelectrode
electrode/pppinnppppinn/counterelectrode
electrode/nnnippnnnippp/counterelectrode
electrode/pppinnnppppinn/counterelectrode
electrode/nnnipppnnnippp/counterelectrode
electrode/pppinnnppppinnn/counterelectrode
electrode/nnnipppppnnnippp/counterelectrode
electrode/pppinnnnnn/counterelectrode
electrode/nnnippipppp/counterelectrode
electrode/pppinnnnpinnnn/counterelectrode
electrode/nnnippnippp/counterelectrode
electrode/pppinppinnnn/counterelectrode
electrode/nnnipnnippp/counterelectrode
electrode/pppinnppinnnn/counterelectrode
electrode/nnnippnnippp/counterelectrode
electrode/pppinnnnnn/counterelectrode
electrode/nnnipppipppp/counterelectrode
electrode/pppinnnpinnn/counterelectrode
electrode/nnnipppnipppp/counterelectrode
electrode/pppinpppinnn/counterelectrode
electrode/nnnipnnnippp/counterelectrode
electrode/pppinnppppinn/counterelectrode
electrode/nnnipnnnippp/counterelectrode
electrode/ppppinnnppinnnn/counterelectrode
electrode/nnnipppnnippp/counterelectrode
electrode/ppppinnppppinnn/counterelectrode
electrode/nnnipppnnippp/counterelectrode
electrode/ppppinnppppinnn/counterelectrode
electrode/nnnippppnipppp/counterelectrode
electrode/ppppinppppinnnn/counterelectrode
electrode/nnnipnnnnippp/counterelectrode
electrode/ppppinnnnppinnn/counterelectrode
electrode/nnnippppnnippp/counterelectrode
electrode/ppppinnppppinnn/counterelectrode
electrode/nnnipnnnippp/counterelectrode
electrode/ppppinnnppppinn/counterelectrode
electrode/nnnippppnnnippp/counterelectrode
electrode/ppppinnnppppinnn/counterelectrode
electrode/nnnipppnnnippp/counterelectrode
electrode/ppppinnnppppinnnn/counterelectrode
electrode/nnnipppppnnnippp/counterelectrode In a further embodiment of the invention, a conversion contact is also present at the electrodes. An electrode/p structure thus becomes an electrode/n/p structure, and an electrode/n structure becomes an electrode/p/n structure. These conversion contacts may be present both at the electrode and at the counterelectrode. The conversion contact can also consist of a plurality of transport layer systems, e.g.:

electrode/nnp
electrode/nnnp
electrode/nnnnp
electrode/ppn
electrode/pppn
electrode/ppppn In a further embodiment of the invention, the conversion contacts are present in all structures described in the above lists, e.g., the first structure in the above lists electrode/pinnin/counterelectrode can be extended with conversion contacts as follows:

electrode/npinnin/counterelectrode
electrode/nnpinnin/counterelectrode
electrode/nnnpinnin/counterelectrode
electrode/nnnnpinnin/counterelectrode
electrode/pinnip/counterelectrode
electrode/pinninpp/counterelectrode
electrode/pinninppp/counterelectrode
electrode/pinninpppp/counterelectrode
electrode/npinninp/counterelectrode
electrode/npinninpp/counterelectrode
electrode/npinninppp/counterelectrode
electrode/npinninpppp/counterelectrode
electrode/nnpinninp/counterelectrode
electrode/nnnpinninp/counterelectrode
electrode/nnnnpinninp/counterelectrode
electrode/nnpinninpp/counterelectrode
electrode/nnnpinninpp/counterelectrode
electrode/nnnnpinninpp/counterelectrode
electrode/nnpinninppp/counterelectrode
electrode/npinninpppp/counterelectrode
electrode/nnnpinninppp/counterelectrode
electrode/nnnpinninpppp/counterelectrode
electrode/nnnnpinninppp/counterelectrode
electrode/nnnnpinninpppp/counterelectrode The last structure in the above lists electrode/nnnnipppp-nnnnipppp/counterelectrode can be analogously extended with conversion contacts as follows:

electrode/pnnnnippppnnnnipppp/counterelectrode
electrode/ppnnnnippppnnnnipppp/counterelectrode
electrode/pppnnnnippppnnnnipppp/counterelectrode
electrode/pppnnnnippppnnnnippp/counterelectrode
electrode/ppppnnnnippppnnnnipppp/counterelectrode
electrode/nnnnippppnnnnippppn/counterelectrode
electrode/nnnnippppnnnnippppnn/counterelectrode
electrode/nnnnippppnnnnippppnnn/counterelectrode
electrode/nnnnippppnnnnippppnnnn/counterelectrode
electrode/pnnnnippppnnnnippppn/counterelectrode
electrode/pnnnnippppnnnnippppnn/counterelectrode
electrode/ppnnnnippppnnnnippppn/counterelectrode
electrode/pppnnnnippppnnnnippppn/counterelectrode
electrode/pnnnnippppnnnnippppnn/counterelectrode
electrode/pnnnnippppnnnnippppnnn/counterelectrode
electrode/ppnnnnippppnnnnippppnn/counterelectrode
electrode/pppnnnnippppnnnnippppnn/counterelectrode
electrode/ppnnnnippppnnnnippppnn/counterelectrode
electrode/ppppnnnnippppnnnnippppnn/counterelectrode
electrode/ppnnnnippppnnnnippppnnn/counterelectrode
electrode/ppnnnnippppnnnnippppnnnn/counterelectrode
electrode/pppnnnnippppnnnnippppnnnn/counterelectrode
electrode/ppppnnnnippppnnnnippppnnn/counterelectrode
electrode/ppppnnnnippppnnnnippppnnnn/counterelectrode In a further embodiment of the invention, a p-doped layer is also present between the first electron-conducting layer (n-layer) and the electrode situated on the substrate, with the result that a pnip or pni structure is involved, wherein the doping is preferably chosen to be high enough that the direct pn contact has no blocking effect, rather low-loss recombination occurs, preferably by means of a tunneling process.

In a further embodiment of the invention, a p-doped layer can also be present in the component between the first photoactive i-layer and the electrode situated on the substrate, with the result that a pip or pi structure is involved, wherein the additional p-doped layer has a Fermi level position situated at most 0.4 eV, but preferably less than 0.3 eV, below the electron transport level of the i-layer, with the result that low-loss electron extraction from the i-layer into this p-layer can occur.

In a further embodiment of the invention, an n-layer system is also present between the p-doped layer and the counterelectrode, with the result that an nipn or ipn structure is involved, wherein the doping is preferably chosen to be high enough that the direct pn contact has no blocking effect, rather low-loss recombination occurs, preferably by means of a tunneling process.

In a further embodiment, an n-layer system can also be present in the component between the intrinsic, photoactive layer and the counterelectrode, with the result that an nin or in structure is involved, wherein the additional n-doped layer has a Fermi level position situated at most 0.4 eV, but preferably less than 0.3 eV, above the hole transport level of the i-layer, with the result that low-loss hole extraction from the i-layer into this n-layer can occur.

In a further embodiment of the invention, the component contains an n-layer system and/or a p-layer system, with the result that a pnipn, pnin, pipn or p-i-n structure is involved, which in all cases are distinguished by the fact that—independently of the conduction type—the layer adjoining the photoactive i-layer on the substrate side has a lower thermal work function than the layer adjoining the i-layer and facing away from the substrate, with the result that photogenerated electrons are preferably transported away toward the substrate if no external voltage is applied to the component.

In a further embodiment of the invention, the absorption range of at least one of the absorber systems extends into the infrared range in the wavelength range of >700 nm to 1500 nm.

In a further embodiment of the invention, the layers of the layer system of the component are embodied as a light trap that lengthens the optical path of the incident light.

In a further embodiment of the invention, the organic materials used are small molecules. Within the meaning of the present invention, small molecules are understood to be non-polymeric organic molecules having monodisperse molar masses of between 100 and 2000 which are present in a solid phase under normal pressure (air pressure of the atmosphere surrounding us) and at room temperature. In particular, said small molecules can also be photoactive, wherein photoactive is understood to mean that the molecules change their charge state under light incidence.

In a further embodiment of the invention, the organic materials used are at least partly polymers.

In a further embodiment of the invention, the organic layers consist at least partly of small molecules, at least partly of polymers or of a combination of small molecules and polymers.

In a further embodiment of the invention, the component is semitransparent at least in a certain light wavelength range.

In a further embodiment of the invention, the component is used on planar, curved or flexible carrier surfaces. Preferably, said carrier surfaces are plastic films or metal films (e.g., aluminum, steel), etc.

In a further embodiment of the invention, at least one of the photoactive mixed layers contains as acceptor a material from the group of fullerenes or fullerene derivatives ($C_{60}$, $C_{70}$, etc.).

In a further embodiment of the invention, at least one of the photoactive mixed layers contains as donor a material from the class of phthalocyanines, perylene derivatives, TPD derivatives, oligothiophenes or a material as described in WO 2006/092134.

In a further embodiment of the invention, the contacts consist of metal, a conductive oxide, in particular ITO, ZnO:Al, or other TCOs, or a conductive polymer, in particular PEDOT:PSS or PANI.

In a further embodiment, the acceptor material in the mixed layer is present at least partly in crystalline form.

In a further embodiment, the donor material in the mixed layer is present at least partly in crystalline form.

In a further embodiment, both the acceptor material and the donor material in the mixed layer are present at least partly in crystalline form.

In a further embodiment, the photoactive layer systems consist of an individual layer, a mixed layer, a combination of individual and mixed layers, a double mixed layer or a triple mixed layer.

In a further embodiment, the photoactive layer system also contains further photoactive individual or mixed layers in addition to the mixed layer mentioned.

In a further embodiment, the n-material system consists of one or more layers.

In a further embodiment, the p-material system consists of one or more layers.

In a further embodiment, the p-type transport layer system contains a p-dopant, wherein said p-dopant is F4-TCNQ, a p-dopant as described in DE 103 38 406, DE 103 47 856, DE 103 57 044, DE 10 2004 010 954, DE 10 2006 053 320, DE 10 2006 054 524 and DE 10 2008 051 737, or a transition metal oxide (VO, WO, MoO, etc.).

In a further embodiment, the n-type transport layer system contains an n-dopant, wherein said n-dopant is a TTF derivative (tetrathiafulvalene derivative) or DTT derivative (dithienothiophene), an n-dopant as described in DE 103 38 406, DE 103 47 856, DE 103 57 044, DE 10 2004 010 954, DE 10 2006 053 320, DE 10 2006 054 524 and DE 10 2008 051 737, or Cs, Li or Mg.

In a further embodiment, one electrode is embodied in transparent fashion with a transmission >80% and the other electrode is embodied in reflective fashion with a reflection of >50%.

In a further embodiment, the component is embodied in semitransparent fashion with a transmission of 10-80%.

In a further embodiment, the electrodes consist of a metal (e.g., Al, Ag, Au or a combination thereof), a conductive oxide, in particular ITO, ZnO:Al or some other TCO (transparent conductive oxide), a conductive polymer, in particular PEDOT/PSS poly(3,4-ethylenedioxythiophene)-poly(styrenesulfonate) or PANI (polyaniline), or of a combination of these materials.

In a further embodiment, the light trap is realized by virtue of the fact that the component is constructed on a periodically microstructured substrate and the homogeneous function of the component, that is to say a short-circuit-free contact-connection and homogeneous distribution of the electric field over the entire area, is ensured by the use of a doped wide-gap layer. Ultrathin components have, on structured substrates, an increased risk of forming local short circuits, with the result that the functionality of the entire component is ultimately jeopardized by such an evident inhomogeneity. This risk of short circuits is reduced by the use of the doped transport layers.

In a further embodiment of the invention, the light trap is realized by virtue of the fact that the component is constructed on a periodically microstructured substrate and the homogeneous function of the component, the short-circuit-free contact-connection thereof and a homogeneous distribution of the electric field over the entire area, is ensured by the use of a doped wide-gap layer. In this case, it is particularly advantageous that the light passes through the absorber layer at least twice, which can lead to an increased light absorption and, as a result, to an improved efficiency of the solar cell. This can be achieved for example by virtue of the fact that the substrate has pyramidal structures on the surface having heights (h) and widths (d) in each case in the range of from one to several hundred micrometers. Height and width can be chosen to be identical or different. The pyramids can likewise be constructed symmetrically or asymmetrically.

In a further embodiment of the invention, the light trap is realized by virtue of the fact that a doped wide-gap layer has a smooth interface with respect to the i-layer and a rough interface with respect to the reflective contact. The rough interface can be achieved for example by means of a periodic microstructuring. The rough interface is particularly advantageous if it reflects the light diffusely, which leads to a lengthening of the light path within the photoactive layer.

In a further embodiment, the light trap is realized by virtue of the fact that the component is constructed on a periodically microstructured substrate and a doped wide-gap layer has a smooth interface with respect to the i-layer and a rough interface with respect to the reflective contact.

In a further embodiment of the invention, the entire structure is provided with a transparent bottom and top contact.

In a further embodiment, the photoactive components according to the invention are used on curved surfaces, such as, for example, concrete, roof tiles, clay, automobile glass, etc. In this case, it is advantageous that the organic solar cells according to the invention, by comparison with conventional inorganic solar cells, can be applied on flexible carriers such as films, textiles, etc.

In a further embodiment, the photoactive components according to the invention are applied to a film or textile which has, on the opposite side to the organic layer system according to the invention, an adhesion means such as, for example, an adhesive. It is thereby possible to produce a solar adhesive film which can be arranged as necessary on any desired surfaces. A self-adhesive solar cell can thus be produced.

BRIEF DESCRIPTION OF THE DRAWINGS

The invention will be explained thoroughly below on the basis of some exemplary embodiments and associated figures. In the figures:

FIGS. 1A and 1B show the schematic layer construction of a photoactive component having two transport layer systems between the photoactive layer systems;

FIG. 3 shows the schematic layer construction of a photoactive component having four transport layer systems between the photoactive layer systems;

FIGS. 4A and 4B show the schematic layer construction of a photoactive component having four transport layer systems between the photoactive layer systems and three transport layer systems at the electrode;

FIG. 5 shows the schematic layer construction of a photoactive component having four transport layer systems between the photoactive layer systems, three transport layer systems at the electrode and three transport layer systems at the counterelectrode;

FIG. 6 shows a schematic energy diagram of a photoactive component having three transport layer systems between the photoactive layer systems;

FIG. 7 shows a schematic energy diagram of a photoactive component having three transport layer systems between the photoactive layer systems;

FIG. 8 shows a schematic energy diagram of a photoactive component having four transport layer systems between the photoactive layer systems;

FIG. 9 shows a schematic energy diagram of a photoactive component having six transport layer systems between the photoactive layer systems;

FIG. 10 shows a schematic energy diagram of a photoactive component having eight transport layer systems between the photoactive layer systems;

DETAILED DESCRIPTION OF ILLUSTRATIVE EMBODIMENTS

Figure 2A:
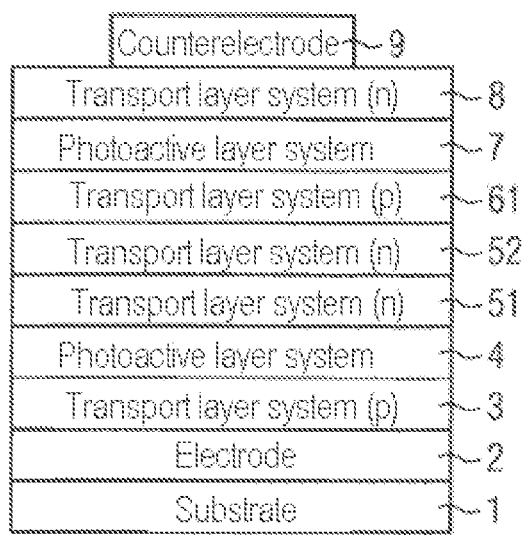
FIGS. 2A and 2B show the schematic layer construction of a photoactive component having three transport layer systems between the photoactive layer systems.

In a first exemplary embodiment, FIG. 1A schematically illustrates a component according to the invention. The latter consists of substrate 1, an electrode 2, and a counterelectrode 9. A photoactive layer system 4 is arranged between the electrode 2 and the counterelectrode 9. A transport layer system 3 embodied in a p-conducting fashion is arranged between the electrode 2 and the photoactive layer system 4. Further layers are arranged between the counterelectrode and the photoactive layer system 4. In this case, the transport layer systems 51 and 52 of the same charge carrier type (in this case electrons) according to the invention are arranged on the photoactive layer system 4, wherein the LUMO level of the transport layer system 51 differs from the LUMO of the photoactive layer system 4 by a maximum of 0.5 eV. Furthermore, the other transport layer system 52 is embodied in a transparent fashion. A further photoactive layer system 7 is arranged on the transport layer systems 51 and 52. A further transport layer system 8 embodied in an n-conducting fashion is arranged between the further photoactive layer system 7 and the counterelectrode 9. FIG. 1B illustrates an embodiment analogous to the photoactive component in FIG. 1A, the construction of the layers of the photoactive component corresponding to an nip structure in FIG. 1B.

Figure 2B:
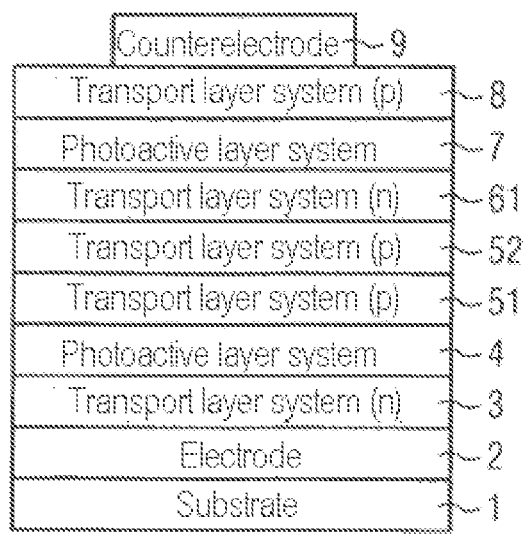

In a second exemplary embodiment, FIGS. 2A and 2B in each case depict a schematic illustration of a component according to the invention. The construction of the component according to the invention is analogous to the first exemplary embodiment in FIGS. 1A and 1B three transport layer systems 51, 52 and 61 being arranged between the photoactive layer systems 4, 7. This results in an efficient charge carrier recombination at the interface between the transport layer systems 52 and 61.

In a third exemplary embodiment, FIG. 3 depicts a schematic illustration of a component according to the invention. The construction of the component according to the invention is analogous to the exemplary embodiment in FIG. 2, four transport layer systems 51, 52, 61 and 62 being arranged between the photoactive layer systems 4, 7.

In a fourth exemplary embodiment, FIGS. 4A and 4B depict a schematic illustration of a component according to the invention. The construction of the component according to the invention is analogous to the exemplary embodiment in FIG. 3, three transport layer systems 31, 32 and 33 being arranged between the photoactive layer system 4 and the electrode 2. The component illustrated schematically in FIG. 4A in this case corresponds to a pin basic structure (specifically a pnnppn structure), while the component illustrated in FIG. 4B corresponds to an nip structure, here an nppnnp structure.

In a fifth exemplary embodiment, FIG. 5 depicts a schematic illustration of a component according to the invention. The construction of the component according to the invention is analogous to the exemplary embodiment in FIGS. 4A and B, the transport layer systems 81, 82 and 83 being arranged between the photoactive layer system 7 and the counterelectrode 9.

FIG. 6 illustrates a HOMO-LUMO level diagram of a component in accordance with the second exemplary embodiment (FIG. 2B). In this case, the recombination zone is situated between the p-type transport layer system 52 and the n-type transport layer system 61.

FIG. 7 illustrates a HOMO-LUMO level diagram of a component in accordance with a further exemplary embodiment. In this case, the construction of the component is analogous to the second embodiment, one transport layer system 51 being arranged between the photoactive layer system 4 and the transport layer system 61.

FIG. 8 illustrates a HOMO-LUMO level diagram of a component in accordance with the fourth exemplary embodiment (FIG. 4B).

FIG. 9 illustrates a HOMO-LUMO level diagram of a component in accordance with a further exemplary embodiment. In this case, the transport layer system 51 is energetically adapted to the photoactive layer system 4 and the transport layer system 63 is energetically adapted to the photoactive layer system 7. The transport layer systems 52 and 62 have good transport properties and can have a greater layer thickness (20 nm to 400 nm) than the transport layer systems 51, 53, 61 and 63. The transport layer systems 53 and 61 enable an efficient recombination of charge carriers.

FIG. 10 illustrates a HOMO-LUMO level diagram of a component in accordance with a further exemplary embodiment. In this case, the construction of the component is analogous to FIG. 9, two further transport layer systems additionally being present.

Figure 11A:
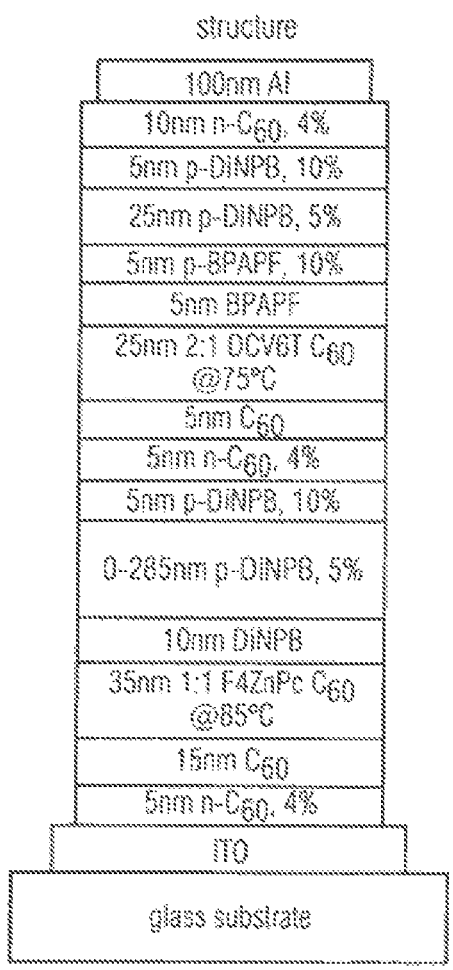
FIGS. 11A and 11B show a schematic layer construction of two exemplary photoactive components.

In a further exemplary embodiment, FIGS. 11A and B show the schematic layer construction of two exemplary photoactive components. In this case, the respective diagram gives the indications of the layer thicknesses in nm, the indications of the doping concentration in %, the indication of the mixing ratios as a volume ratio X:Y (e.g., 2:1) and the indication of the substrate temperature during evaporation in ° C. The two doped DiNPB layers (p-DiNPB) between the absorber layers (absorber system 1: mixed layer BDR001: C60; absorber system 2: mixed layer DC6T:C60) contain different dopants (dopant 1 in a concentration of 5% and dopant 2 in a concentration of 10%). In this case, the material BPAPF denotes 9,9-bis(4-N,N-bisbiphenyl-4-yl-amino)phenyl)-9H-fluorene and the material DiNPB is N,N-diphenyl-N,N-bis(4-(N,N-bis(naphtha-1-yl)amino)biph-enyl-4-yl) benzidine.

Figure 12:
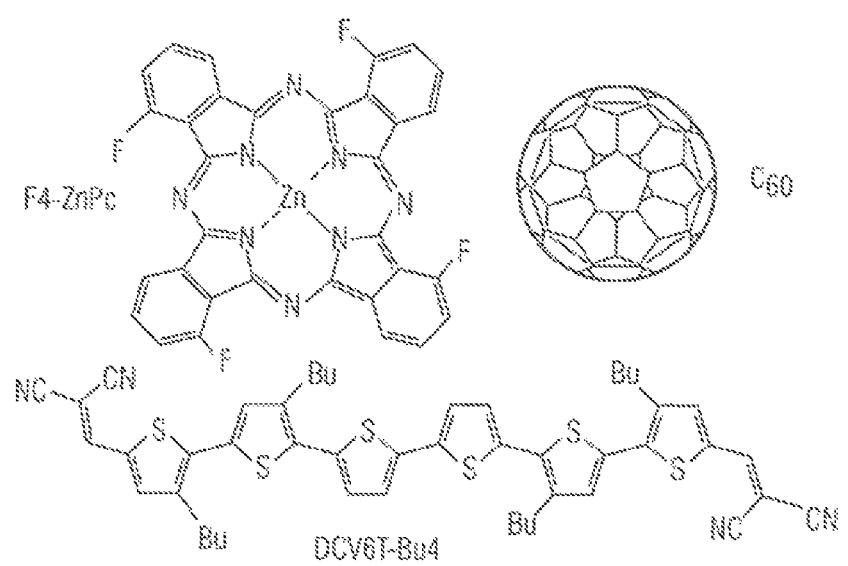
FIG. 12 shows the structural formulae of the materials DCV6T, F4-ZnPc and C60.

The structural formulae of the materials DCV6T, F4-ZnPc and C60 are illustrated in FIG. 12.

Figure 11B:
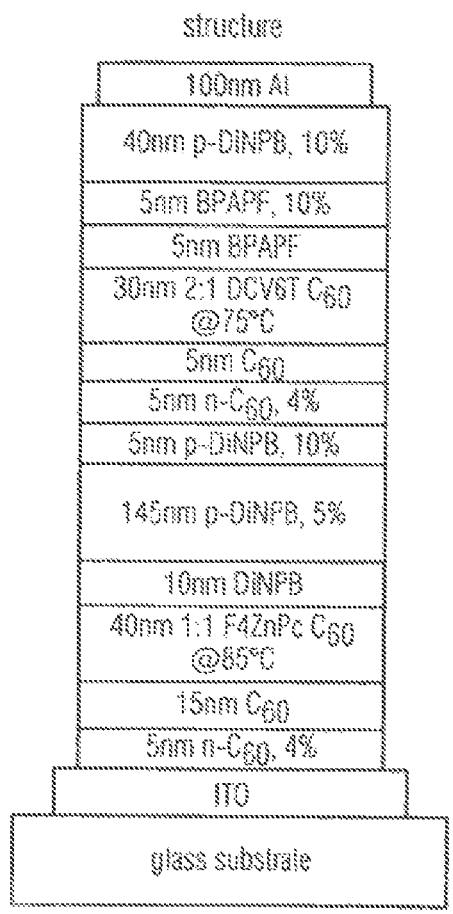
Figure 13:
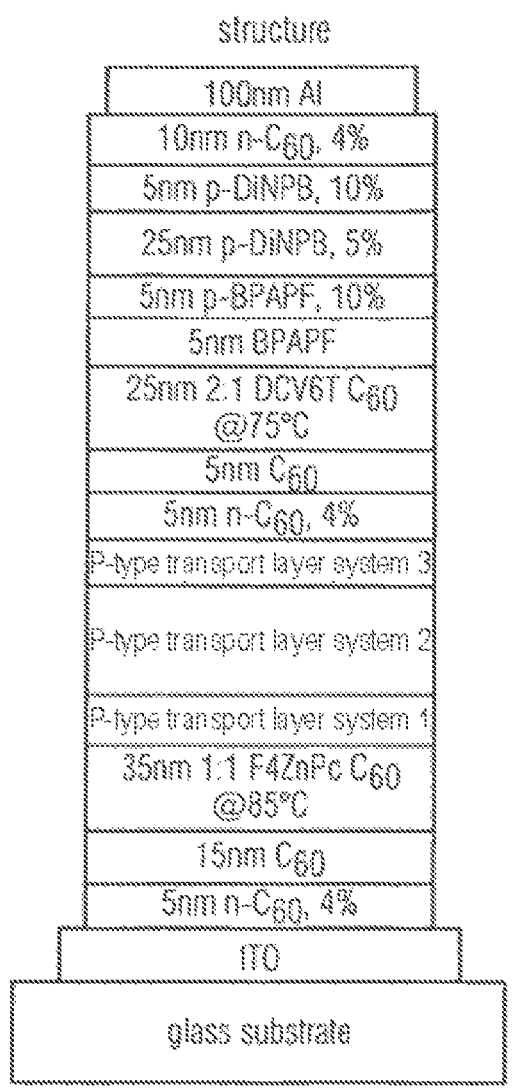
FIG. 13 shows the schematic layer construction of an exemplary photoactive component analogous to FIG. 11, wherein three different p-type transport layer systems 1, 2 and 3 are present between the photoactive absorber systems.

In a further exemplary embodiment, FIG. 13 illustrates the schematic layer construction of an exemplary photoactive component analogous to FIG. 11: three different p-type transport layer systems 1, 2 and 3 are arranged between the photoactive absorber systems.

The invention claimed is:

1. A photoactive component comprising:
   an electrode;
   a counterelectrode; and
   an organic layer system arranged between the electrode and the counterelectrode, the organic layer system comprising:
      a first photoactive layer system;
      a second photoactive layer system; and
      first and second different transport layer systems between the first and second photoactive layer systems, wherein the first and second different transport layer systems have the same charge carrier type, wherein the first transport layer system includes a material that is not within the second transport layer system, and wherein the first transport layer system is energetically adapted to the first photoactive layer system and the second transport layer system is embodied in a transparent fashion.

2. The photoactive component according to claim 1, wherein the first and/or second transparent transport layer system has a conductivity of $\geq 1 \times 10^{-6}$ S/cm and/or is doped.

3. The photoactive component according to claim 1, wherein the first and second transport layer systems directly adjoin one another and/or both are transparent.

4. The photoactive component according to claim 1, wherein one or both the first and second transport layer systems comprise one or more organic materials.

5. The photoactive component according to claim 1, wherein transport energy level positions of the transparent transport layer system are in the range of −5.5 eV to −4.9 eV if a p-type transport layer system is involved and are in the range of −4.5 eV to −3.5 eV if an n-type transport layer system is involved.

6. The photoactive component according to claim 1, wherein one or both the first and second transport layer systems are undoped or doped or the doping has a gradient or the doping has different concentrations within the layer.

7. The photoactive component according to claim 1, wherein the first and second transport layer systems are doped with different materials of the same doping type.

8. The photoactive component according to claim 1, further comprising a further transport layer system between the first and second photoactive layer systems, the further transport layer having a charge carrier type opposite the same charge carrier type.

9. The photoactive component according to claim 1, further comprising two further transport layer systems between the first and second photoactive layer systems, the further transport layer having a charge carrier type opposite the same charge carrier type, wherein one further transport layer system is energetically adapted to the other photoactive layer system and the other further transport layer system is transparent.

10. The photoactive component according to claim 9, wherein the further transport layer system is an individual layer, is a mixed layer, is undoped, is doped, the doping has a gradient, the doping has different concentrations within the layer and/or are doped with different dopants.

11. The photoactive component according to claim 1, further comprising a plurality of transport layer systems between one of the first and second photoactive layer systems and the electrode and/or between the other of the first and second photoactive layer systems and the counterelectrode, wherein one transport layer system is energetically adapted to the respective photoactive layer system and the second transport layer system is transparent.

12. The photoactive component according to claim 1, further comprising a third transport layer system between the organic layer system and the electrode and/or the counterelectrode, wherein the first transport layer system is energetically adapted to the respective photoactive layer system, the second transport layer system is transparent and the third transport layer system is energetically adapted to the electrode or counterelectrode.

13. The photoactive component according to claim 1, wherein the transport layer systems present in the component, independently of one another, are embodied as individual layers or mixed layers or consist of nanoclusters, are embodied as transparent or semitransparent, are undoped or doped, wherein the doping has a gradient or the doping has different concentrations within the layer, and/or the transport layer systems are doped with different dopants.

14. The photoactive component according to claim 1, wherein the component is a tandem or multiple cell.

15. The photoactive component according to claim 1, wherein the component consists of a combination of nip, ni, ip, pnip, pni, pip, nipn, nin, ipn, pnipn, pnin or pipn structures, in which two or more independent combinations containing at least one i-layer are stacked one above another.

16. The photoactive component according to claim 1, further comprising a carrier, wherein the electrode, counterelectrode and organic layer system are arranged on a surface of the carrier.

17. The photoactive component according to claim 16, wherein the surface comprises a planar, curved or flexible carrier surface.

18. The photoactive component according to claim 1, wherein the material that is included in the first transport layer system but not within the second transport layer system comprises a material that influences at least one function or property of the first and second different transport layer systems.

19. The photoactive component according to claim 18, wherein the at least one function or property comprises at least one of energetic adaptation, transport properties and transparency.

* * * * *